(12) United States Patent
Yamashita

(10) Patent No.: US 12,181,146 B2
(45) Date of Patent: Dec. 31, 2024

(54) WAVELENGTH CONVERSION MEMBER AND LIGHT-EMITTING DEVICE

(71) Applicant: NICHIA CORPORATION, Anan (JP)

(72) Inventor: Toshiaki Yamashita, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 18/336,785

(22) Filed: Jun. 16, 2023

(65) Prior Publication Data

US 2023/0332758 A1    Oct. 19, 2023

Related U.S. Application Data

(63) Continuation of application No. 18/054,132, filed on Nov. 9, 2022, now Pat. No. 11,719,415.

(30) Foreign Application Priority Data

Nov. 16, 2021    (JP) ................. 2021-186402

(51) Int. Cl.
*F21V 7/26* (2018.01)
*F21Y 115/10* (2016.01)
(Continued)

(52) U.S. Cl.
CPC ............. *F21V 7/26* (2018.02); *F21Y 2115/10* (2016.08); *F21Y 2115/30* (2016.08); *H01L 33/502* (2013.01); *H01L 2933/0041* (2013.01)

(58) Field of Classification Search
CPC .................. F21V 7/26; H01L 33/502; H01L 2933/0041

See application file for complete search history.

(56) References Cited

U.S. PATENT DOCUMENTS

2013/0170179 A1    7/2013  Kadomi et al.
2015/0298424 A1    10/2015 Menke et al.
(Continued)

FOREIGN PATENT DOCUMENTS

EP    3093893 A1 * 11/2016 ............. F21V 11/16
JP    2009-177106 A    8/2009
(Continued)

OTHER PUBLICATIONS

KR-20190098640-A.*
Notice of Allowance in the related U.S. Appl. No. 18/054,132 dated Mar. 20, 2023.

*Primary Examiner* — Karabi Guharay
(74) *Attorney, Agent, or Firm* — Global IP Counselors, LLP

(57) ABSTRACT

A wavelength conversion member includes three or more light-emitting portions, and two or more light shielding layers. Each of the three or more light-emitting portions has a phosphor, is separated from each other, and is disposed to be aligned in a first direction. Each of the two or more light shielding layers is disposed between the two light-emitting portions adjacent to each other. The light-emitting portion and the light shielding layer are alternately aligned in the first direction. In the first direction, a length of each of the light-emitting portions is in a range of 0.3 mm to 2.0 mm. An interval in the first direction between the two light-emitting portions adjacent to each other is in a range of 0.1 mm to 2.0 mm.

14 Claims, 15 Drawing Sheets

(51) Int. Cl.
*F21Y 115/30* (2016.01)
*H01L 33/50* (2010.01)

(56) References Cited

U.S. PATENT DOCUMENTS

| | | |
|---|---|---|
| 2016/0336491 A1 | 11/2016 | Gootz |
| 2019/0198732 A1 | 6/2019 | Shimizu et al. |
| 2020/0335676 A1 | 10/2020 | Wakamatsu |

FOREIGN PATENT DOCUMENTS

| | | | | |
|---|---|---|---|---|
| JP | 2012-119407 A | | 6/2012 | |
| JP | 2015-203004 A | | 11/2015 | |
| JP | 2017-510833 A | | 4/2017 | |
| JP | 2018132662 A | * | 8/2018 | ............... F23B 5/02 |
| JP | 2021-507307 A | | 2/2021 | |
| KR | 20190098640 A | * | 8/2019 | |

* cited by examiner

WAVELENGTH CONVERSION MEMBER AND LIGHT-EMITTING DEVICE

CROSS-REFERENCE TO RELATED APPLICATION

This application is a continuation application of U.S. patent application Ser. No. 18/054,132, filed on Nov. 9, 2022. This application claims priority to Japanese Patent Application No. 2021-186402 filed on Nov. 16, 2021. The entire disclosures of U.S. patent application Ser. No. 18/054,132 and Japanese Patent Application No. 2021-186402 are is hereby incorporated herein by reference.

BACKGROUND

The present disclosure relates to a wavelength conversion member, a method of manufacturing the same, and a light-emitting device.

Japanese Patent Application Publication No. 2021-507307 A describes a device including a phosphor ceramic on which light from a plurality of light-emitting diodes is incident. The device has an optical barrier in the phosphor ceramic to reduce propagation of light in a lateral direction. The phosphor ceramic is formed, for example, by repeatedly folding, slicing, and firing two or more layer films composed of a phosphor ceramic precursor and a light barrier/reflector/scatterer.

SUMMARY

An object of the present disclosure is to provide a wavelength conversion member including a wavelength conversion portion including a plurality of light-emitting portions, wherein an effect of reducing propagation of light from an adjacent light-emitting portion is improved, and a method of manufacturing the same. Another object of the present invention is to provide a light-emitting device including the wavelength conversion member.

A wavelength conversion member according to an embodiment of the present disclosure includes three or more light-emitting portions, and two or more light shielding layers. Each of the three or more light-emitting portions has a phosphor, is separated from each other, and is disposed to be aligned in a first direction. Each of the two or more light shielding layers is disposed between the two light-emitting portions adjacent to each other. The light-emitting portion and the light shielding layer are alternately aligned in the first direction. In the first direction, a length of each of the light-emitting portions is in a range of 0.3 mm to 2.0 mm. An interval in the first direction between the two light-emitting portions adjacent to each other is in a range of 0.1 mm to 2.0 mm.

A light-emitting device according to an embodiment of the present disclosure includes three or more light-emitting elements, and the wavelength conversion member described above. Light emitted from each of the three or more light-emitting elements is incident on a respective one of the light-emitting portions.

A light-emitting device according to an embodiment of the present disclosure includes a light-emitting element configured to emit light, and the wavelength conversion member as described above. An output of the light incident on each light-emitting portion is individually controllable.

According to an embodiment of the present disclosure, it is possible to provide a wavelength conversion member including a wavelength conversion portion including a plurality of light-emitting portions, wherein an effect of suppressing propagation of light from an adjacent light-emitting portion is improved, and a method of manufacturing the same. Also, it is possible to provide a light-emitting device including this wavelength conversion member.

DETAILED DESCRIPTION OF EMBODIMENTS

Figure 1:
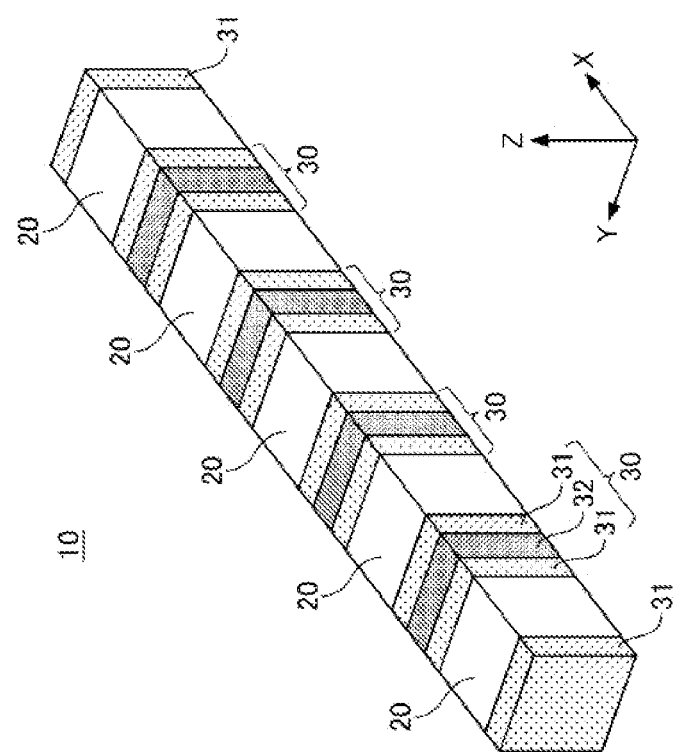
FIG. 1 is a schematic perspective view of a wavelength conversion member according to a first embodiment.

Hereinafter, certain embodiments of the invention will be described with reference to the drawings. In the following description, terms indicating a specific direction or position (e.g., "upper", "lower", and other terms including those terms) are used as necessary. The use of those terms, however, is to facilitate understanding of the invention with reference to the drawings, and the technical scope of the present invention is not limited by the meaning of those terms. In addition, parts having the same reference numerals appearing in a plurality of drawings indicate identical or equivalent parts or members.

In the present disclosure, for polygonal shapes such as triangles and quadrangles, shapes in which the corners of the polygon are rounded, chamfered, beveled, coved, and the like, are also referred to as polygonal shapes. Furthermore, not only shapes with such modifications at corners (ends of sides) but also shapes with modifications at intermediate portions of sides are similarly referred to as polygons. In other words, a polygon-based shape with a partial modification is included in the interpretation of the "polygonal shape" described in the present disclosure.

The same applies not only to polygons but also to terms representing specific shapes such as trapezoids, circles, protrusions, and recesses. Furthermore, the same applies when dealing with each side forming that shape. In other words, even when on a corner or an intermediate portion of a side is modified, the interpretation of "side" includes the modified portion. When a "polygonal shape" or a "side" without partially modification is to be distinguished from a shape with modification, "in a strict sense" will be added to the description as in, for example, "quadrangle in a strict sense".

Further, the following embodiments exemplify a wavelength conversion member, etc. for embodying the technical idea of the present invention, and the present invention is not limited to the description below. In addition, unless otherwise specified, the dimensions, materials, shapes, relative arrangements, and the like of constituent elements described below are not intended to limit the scope of the present invention to those alone, but are intended to be exemplified. The contents described in one embodiment can be applied to other embodiments and modification examples.

The size, positional relationship, and the like of the members illustrated in the drawings can be exaggerated in order to clarify the explanation. Furthermore, in order to avoid excessive complication of the drawings, a schematic view in which some elements are not illustrated may be used, or an end view illustrating only a cutting surface may be used as a cross-sectional view.

First Embodiment

FIG. 1 is a schematic perspective view of a wavelength conversion member according to a first embodiment. As illustrated in FIG. 1, the wavelength conversion member 10 includes a plurality of light-emitting portions 20 and a plurality of layered bodies 30. Components of the wavelength conversion member 10 will be described. In FIG. 1, an X-axis, a Y-axis, and a Z-axis that are mutually orthogonal are illustrated for reference. Directions parallel to the X-axis, the Y-axis, and the Z-axis are defined as a first direction X, a second direction Y, and a third direction Z, respectively.

Light-Emitting Portion 20

The light-emitting portions 20 each have an upper surface, a lower surface opposite to the upper surface, and a plurality of lateral surfaces meeting the upper surface and the lower surface. In FIG. 1, in each of the light-emitting portions 20, the third direction Z is a direction perpendicular to the upper surface and/or the lower surface thereof. The plurality of lateral surfaces are connected to an outer edge of the upper surface and an outer edge of the lower surface. Each of the light-emitting portions 20 has, for example, a rectangular parallelepiped shape. Further, the upper surface of each of the light-emitting portions 20 is rectangular. In the example of FIG. 1, each of the light-emitting portions 20 is a cube. The upper surface, the lower surface, and the four lateral surfaces of each of the light-emitting portions 20 are all square. However, the shape of each of the light-emitting portions 20 is not limited these shapes.

In each of the light-emitting portions 20, the upper surface or the lower surface may be a light incident surface, and the lower surface or the upper surface may be a light emission surface. Light having a predetermined wavelength incident on the light incident surface can be converted into light having a different wavelength, and the converted light can be emitted from the light emission surface. Each of the light-emitting portions 20 may emit a portion of the incident light. Each of the light-emitting portions 20 may convert all the incident light into light having a different wavelength. In this case, the light incident on each of the light-emitting portions 20 is not emitted from each of the light-emitting portions 20.

Each of the light-emitting portions 20 is irradiated with light, and thus each of the light-emitting portions 20 is preferably formed mainly of an inorganic material that is not easily decomposed by light irradiation as a base material. The main material is, for example, a ceramic. Examples of the ceramic used for the main material include, aluminum oxide, aluminum nitride, silicon oxide, yttrium oxide, zirconium oxide, and magnesium oxide, etc. The main material of the ceramic is preferably selected from materials having a melting point in a range of 1200° C. to 2500° C. in order to prevent deterioration caused by heat, such as deformation or discoloration, of each of the light-emitting portions 20. Each of the light-emitting portions 20 is, for example, a sintered body formed from a ceramic as a main material.

Each of the light-emitting portions 20 can be formed by sintering, for example, a phosphor and a light-transmissive material such as aluminum oxide. The content of the phosphor can be in a range of 0.05 vol % to 50 vol % with respect to the total volume of the ceramic. Further, for example, each of the light-emitting portions 20 may be formed by sintering a powder of the phosphor, that is, using a ceramic substantially consisting of only the phosphor. Furthermore, each of the light-emitting portions 20 may be formed from a single crystal of a phosphor.

Examples of the phosphor include yttrium aluminum garnet (YAG) activated with cerium, lutetium aluminum garnet (LAG) activated with cerium, silicate activated with europium ((Sr, Ba)$_2$SiO$_4$), αSiAlON phosphor, and βSiAlON phosphor.

Among them, the YAG phosphor has good heat resistance. Thus, each of the light-emitting portions 20 is mainly made of a ceramic having a phosphor.

For example, in a case in which each of the light-emitting portions 20 includes the YAG phosphor, when blue excitation light is incident on the lower surface, white light can be emitted from the upper surface by combining the blue excitation light and yellow fluorescence.

Layered Body 30

Each of the layered bodies 30 is a structure in which a light reflecting layer 31, a light shielding layer 32, and the light reflecting layer 31 are layered in this order. In FIG. 1, the light reflecting layer 31 and the light shielding layer 32 are indicated by dot patterns having different densities instead of assigning reference numerals to all of the light reflecting layer 31 and the light shielding layer 32.

The light reflecting layer 31 has light reflectivity. The light reflecting layer 31 has a reflectivity of 70% or more with respect to light incident from the light-emitting portion 20. The light reflecting layer 31 more preferably has a reflectivity of 80% or more. A thickness of the light reflecting layer 31 is preferably in a range of 30 µm to 1000 µm, for example.

As a main material of the light reflecting layer 31, for example, a ceramic can be used. Examples of the ceramic to be used as the main material include aluminum oxide, yttrium oxide, titanium oxide, zirconium oxide, and silicon oxide. The light reflecting layer 31 may be formed from a material other than the ceramic.

The light shielding layer 32 is adapted to shield or attenuate incident light. The light shielding layer 32 preferably has a transmittance of 20% or less with respect to incident light. More preferably, the light shielding layer 32 has a transmittance of 15% or less. With such a light transmittance of the light shielding layer 32, it is possible to reduce interference of light between the light-emitting portions 20 described below. Also, the light shielding layer 32 can contain a light absorber.

In this case, the light shielding layer 32 preferably has an absorptance of 70% or more for light incident through the light reflecting layer 31. More preferably, the light shielding layer 32 has an absorptance of 80% or more. With such a configuration, the effects described above can be further enhanced. The light shielding layer 32 may not contain a light absorber.

A thickness of the light shielding layer 32 is preferably in a range of 30 μm to 1000 μm, for example.

The light shielding layer 32 is, for example, a layer containing the same ceramic as the main material forming the light reflecting layer 31 as a main material and further containing a dark-colored ceramic that absorbs light. Examples of the dark color include black, brown, navy blue, and gray. Among them, the black color having a high light absorptance is preferable. When the main material of the light shielding layer 32 is the same ceramic as a ceramic used as the main material of the light reflecting layer 31, it is possible to reduce the possibility of occurrence of cracking, breaking, etc., due to a difference in shrinkage rate during sintering in the manufacturing step of the wavelength conversion member 10 described later. The main material of the light shielding layer 32 may be a ceramic that is different from the main material of the light reflecting layer 31. Examples of the ceramic used as the main material of the light shielding layer 32 include aluminum oxide, yttrium oxide, titanium oxide, zirconium oxide, silicon oxide, etc., which are exemplified above as the ceramic used as the main material of the light reflecting layer 31. Examples of the dark-colored ceramic included in the light shielding layer 32 along with the ceramic of the main material include ruthenium oxide, aluminum nitride, silicon nitride, etc. In this specification, a ceramic having a property of absorbing light is included in the light absorber. The light shielding layer 32 may be formed from a material other than a ceramic.

Wavelength Conversion Member 10

In FIG. 1, the light reflecting layer 31, the light shielding layer 32, and the light reflecting layer 31 are layered in the first direction X in each layered body 30 (hereinafter, the first direction X in FIG. 1 may be referred to as a layering direction). In the wavelength conversion member 10, the light-emitting portion 20 and the layered body 30 are alternately aligned in the layering direction of the layered body 30. In other words, in the wavelength conversion member 10, each layered body 30 is disposed between light-emitting portions 20 adjacent to each other in the layering direction, and the light-emitting portions 20 are separated from each other with a respective layered body 30 disposed therebetween. Each of the light-emitting portions 20 is disposed such that, in a top view, the centers of the light-emitting portions 20 are aligned on a straight line parallel to the layering direction.

In the illustrated wavelength conversion member 10, among the plurality of light-emitting portions 20, at each of two light-emitting portions 20 that are opposite outermost light-emitting portions 20 in the layering direction (first direction X), the light reflecting layer 31 is provided on a lateral surface of a respective light-emitting portion 20 opposite to a lateral surface of the respective light-emitting portion in contact with the layered body 30. In the illustrated example, the light reflecting layers 31 are provided on both ends of the wavelength conversion member 10. The light reflecting layer 31 provided in contact with the light-emitting portion 20 is a lateral surface of the wavelength conversion member 10. At the light reflecting layer 31 located at each of both ends, the light shielding layer 32 is not provided on a lateral surface of the light reflecting layer 31 opposite to a lateral surface of the light reflecting layer 31 in contact with the light-emitting portion 20. The wavelength conversion member is not limited to have the configuration in which the light reflecting layers 31 are disposed on both ends, and may be in various forms. This will be described below.

The wavelength conversion member 10 has a rod-like shape having a square planar shape when viewed in the layering direction. In the present specification, the term "rod-like shape" refers to a shape elongated in the layering direction. The planar shape of the wavelength conversion member 10 when viewed from the layering direction is not necessarily a square. The lengths in the layering direction of the light-emitting portions 20 are preferably equal to each other. Additionally, the lengths in the layering direction of the layered bodies 30 are preferably equal to each other. Accordingly, the pitch of the light-emitting portions 20 can be made uniform in the wavelength conversion member 10. In the present specification, the term "equal" allows a difference within ±10%. The pitch of the light-emitting portions 20 can be, for example, in a range of 0.1 mm to 2.0 mm. The variation in the pitch of the light-emitting portions 20 can be, for example, ±5% or less with respect to the average value of the pitch of the light-emitting portions 20.

In the layering direction, the length of each of the layered bodies 30 is preferably shorter than the length of each of the light-emitting portions 20. With this structure, the pitch of the light-emitting portions 20 can be narrowed in the wavelength conversion member 10. The length of each of the layered bodies 30 may be the same as or longer than the length of each of the light-emitting portions 20 in the layering direction. In the layering direction, the length of each of the light-emitting portions 20 is, for example, in a range of 0.3 mm to 2.0 mm. More preferably, the length of each of the light-emitting portions 20 is in a range of 0.5 mm to 1.5 mm. In the layering direction, the length of each of the layered bodies 30 is, for example, in a range of 0.1 mm to 2.0 mm. In the layering direction, the length of each of the layered bodies 30 may be equal to or greater than a half of a length of the respective light-emitting portion 20 and equal to or less than twice the length of the respective light-emitting portion 20.

The wavelength conversion member 10 has the plurality of light-emitting portions 20, and the layered body 30 is disposed between adjacent ones of the light-emitting portions 20. This allows for reducing interference of the light when light enters the adjacent light-emitting portions 20. This is described in detail below.

In each of the light-emitting portions 20, the light reflecting layers 31 are disposed in contact with the two lateral surfaces intersecting the layering direction. Accordingly, light that is wavelength-converted by the phosphor included in each of the light-emitting portions 20 and emitted from the lateral surface of each of the light-emitting portions 20 toward the light reflecting layer 31 is reflected to each of the light-emitting portions 20. Further, light that is incident on a respective light-emitting portion 20, is not wavelength-converted by the respective light-emitting portion 20, and is emitted from a lateral surface of the respective light-emitting portion 20 toward the light reflecting layer, is reflected to each of the light-emitting portions 20. This allows for improving the luminous efficacy of each of the light-emitting portions 20.

Furthermore, from the perspective of further improving the luminous efficiency of each of the light-emitting portions 20, the light reflecting layer 31 is preferably formed from a ceramic. When light from each of the light-emitting portions 20 reaches the surface of the light reflecting layer 31, the light including the evanescent light seeps into the light reflecting layer 31. When the light reflecting layer 31 is formed from a ceramic, absorption of seeped light from each of the light-emitting portions 20 can be reduced and reflection of light can be increased as compared with a case in which the light reflecting layer 31 is formed from metal, etc. Therefore, it is possible to reduce a decrease in the luminous efficiency of each of the light-emitting portions 20.

The light shielding layers 32 are disposed such that light reflecting layers 31 are in contact with two lateral surfaces of each light shielding layer 32 that intersect the layering direction. Each light shielding layer 32 is disposed so as to be located between adjacent light-emitting portions 20 in the layering direction. Accordingly, it is possible to reduce interference of light emitted from adjacent light-emitting portions 20. The light reflecting layer 31 and the light-emitting portion 20 are arranged in this order on both lateral sides of each light shielding layer 32. The arrangement of the light-emitting portion 20, the light reflecting layer 31, and the light shielding layer 32 will be further described below.

In the illustrated example, one of the plurality of light-emitting portions 20 included in the wavelength conversion member 10 is referred to as a first light-emitting portion, and a light-emitting portion adjacent to the first light-emitting portion with the layered body 30 disposed therebetween is referred to as a second light-emitting portion. Light incident on the first light-emitting portion includes a portion of light that is not wavelength-converted by the phosphor and travels in a direction toward the adjacent second light-emitting portion. Most of the portion of the light is reflected at the light reflecting layer 31 and returns to the first light-emitting portion side. A portion of the light incident on the first light-emitting portion and wavelength-converted by the phosphor travels toward an adjacent second light-emitting portion, but a large part of the portion of the light is reflected at the light reflecting layer 31 and returns to the first light-emitting portion side. A portion of the light incident on the light reflecting layer 31 from the first light-emitting portion may pass through the light reflecting layer 31 and seep toward the second light-emitting portion. However, an entirety or a part of the seeped light from the light reflecting layer 31 toward the second light-emitting portion is absorbed by the light shielding layer 32. Thus, light reaching the second light-emitting portion can be reduced as compared with the case in which the light shielding layer 32 is not provided. Similarly, a large portion of the light incident on the second light-emitting portion and traveling toward the first light-emitting portion after wavelength conversion by the phosphor and/or a large portion of the light traveling toward the first light-emitting portion without wavelength conversion is reflected at the light reflecting layer 31 and returns to the second light-emitting portion side. A portion of the light incident on the light reflecting layer 31 from the second light-emitting portion may pass through the light reflecting layer 31 and seep toward the first light-emitting portion. However, an entirety or a part of the seeped light is absorbed by the light shielding layer 32. Thus, light reaching the first light-emitting portion can be reduced as compared with the case in which the light shielding layer 32 is not provided. In this manner, it is possible to reduce the interference between the light incident on the first light-emitting portion and the light incident on the second light-emitting portion.

Thus, for example, when light is incident on the first light-emitting portion and is not incident on the second light-emitting portion, it is possible to reduce propagation of a portion of the light incident on the first light-emitting portion to the second light-emitting portion and light emission from the second light-emitting portion.

That is, it is possible to realize the wavelength conversion member 10 that improves the effect of reducing the propagation of light from an adjacent light-emitting portion 20. As a result, light can be emitted individually from each of the light-emitting portions 20 without substantially causing interference with light in adjacent light-emitting portions 20. In addition, the effect of reducing the propagation of light from the adjacent light-emitting portions 20 can be obtained even when a thickness of the layered body 30 is reduced, and thus it is possible to realize the wavelength conversion member 10 in which the propagation of light from an adjacent light-emitting portion 20 is reduced and the pitch of the light-emitting portions 20 is reduced.

When the layered body 30 is formed only from the light shielding layer 32, the light shielding layer 32 absorbs a large portion of the seeped light from the light-emitting portion 20 including evanescent light, and thus the luminous efficiency of the light-emitting portion 20 may be decreased. In the wavelength conversion member 10, with the layered body 30 having a layered structure of the light reflecting layer 31, the light shielding layer 32, and the light reflecting layer 31, a large portion of the seeped light from the light-emitting portion 20 can be reflected at the light reflecting layer 31, and a portion of the light passing through the light reflecting layer 31 without being reflected at the light reflecting layer 31 can be absorbed by the light shielding layer 32. Accordingly, it is possible to improve the luminous efficiency of the light-emitting portion 20 and impede the light emitted by each of the light-emitting portions 20 from being incident on another light-emitting portion 20.

In addition, for example, in a case in which laser light is incident on the light-emitting portion 20, generation of heat from the light-emitting portion 20 may be larger than in a case in which light from a light-emitting diode is incident on the light-emitting portion 20. Because a ceramic is less likely to deteriorate even at a high temperature due to heat generated by the light-emitting portion 20, forming the light reflecting layer 31 from a ceramic allows for maintaining the functions of the layered body 30 and the light-emitting portion 20.

Method of Manufacturing Wavelength Conversion Member

A method of manufacturing a wavelength conversion member according to the first embodiment includes: preparing a composite in which a layered body and a ceramic sheet having a phosphor are alternately layered, the layered body including a green sheet including a reflective material, a green sheet including a light shielding material, and the green sheet including the reflective material that are layered in this order; and pressurizing and firing the composite. The method of manufacturing the wavelength conversion member according to the first embodiment may include other steps.

Figure 3:
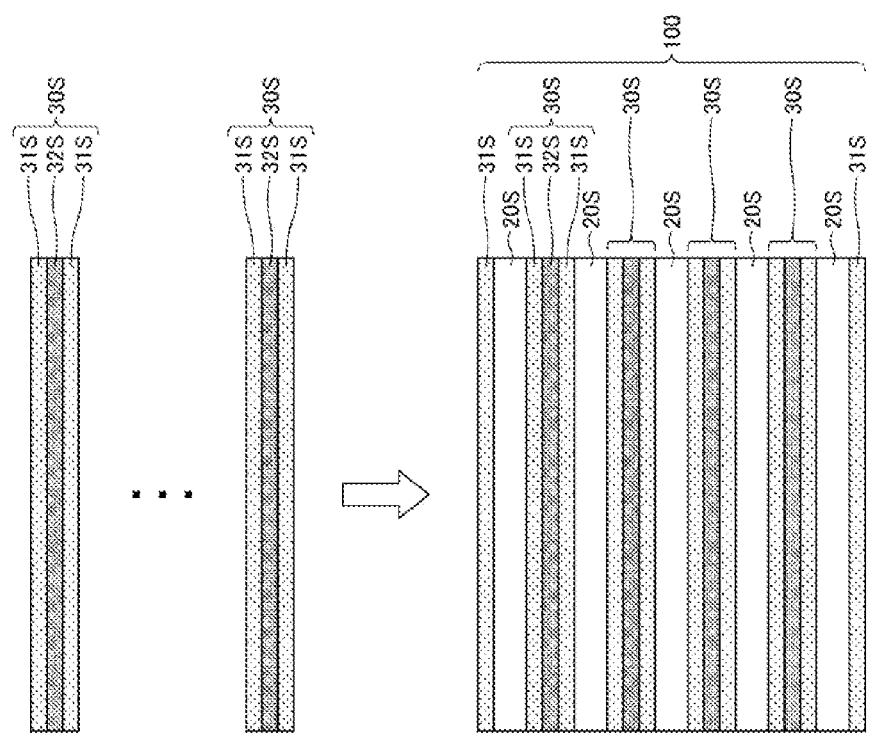
FIG. 3 is another schematic diagram illustrating the method of manufacturing the wavelength conversion member according to the first embodiment.
Figure 4:
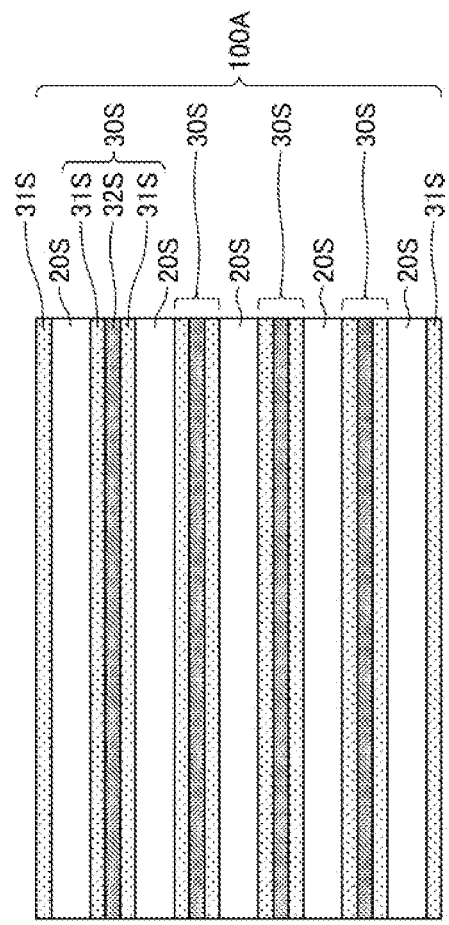
FIG. 4 is even another schematic diagram illustrating the method of manufacturing the wavelength conversion member according to the first embodiment.
Figure 5:
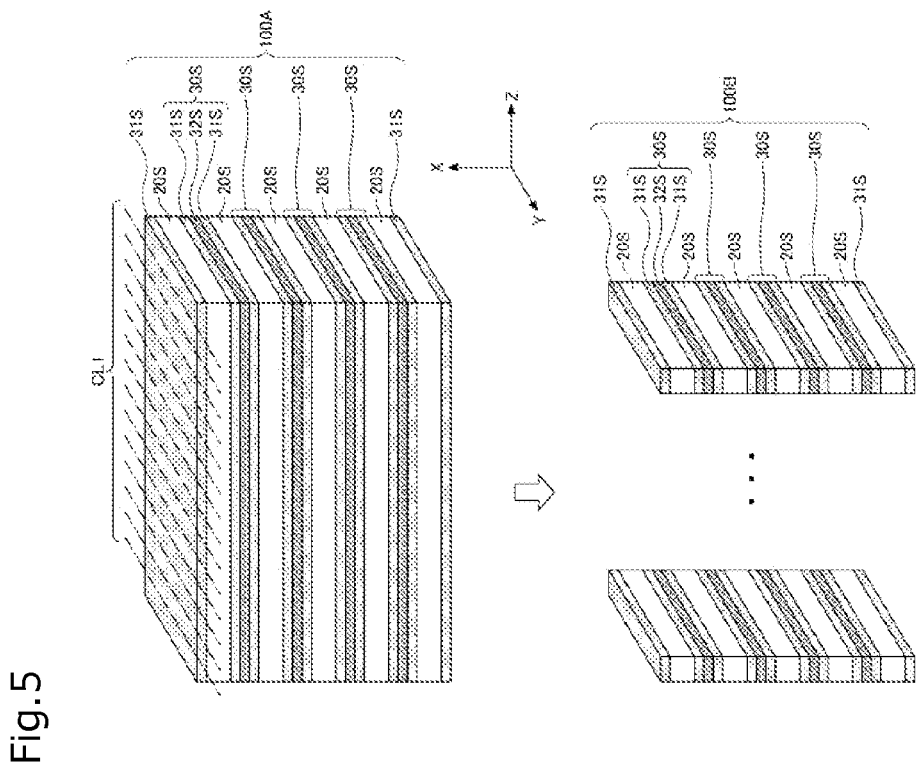
FIG. 5 is yet another schematic diagram illustrating the method of manufacturing the wavelength conversion member according to the first embodiment.
Figure 6:
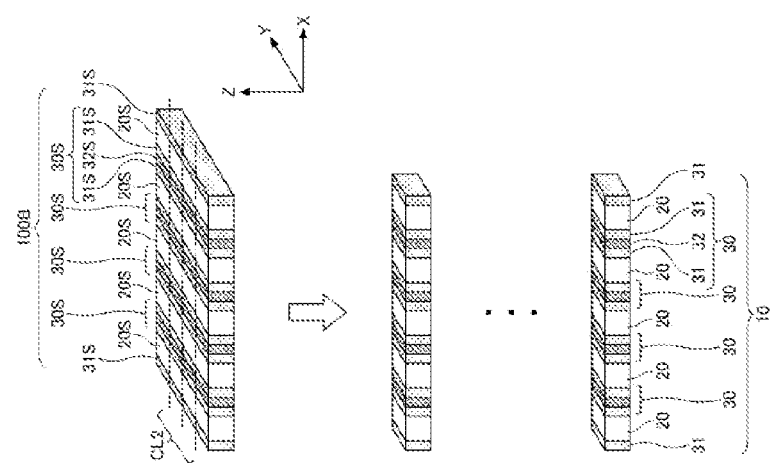
FIG. 6 is still another schematic diagram illustrating the method of manufacturing the wavelength conversion member according to the first embodiment.

FIGS. 2 to 6 are schematic diagrams illustrating a method of manufacturing the wavelength conversion member according to the first embodiment. Here, the method of manufacturing the wavelength conversion member 10 illustrated in FIG. 1 is described as an example of the method of manufacturing the wavelength conversion member according to the first embodiment with reference to FIGS. 2 to 6 sequentially. In FIGS. 5 and 6, the X-axis, the Y-axis, and the Z-axis orthogonal to each other are illustrated for reference. Directions parallel to the X-axis, the Y-axis, and the Z-axis are defined as a first direction X, a second direction Y, and a third direction Z, respectively.

Figure 2:
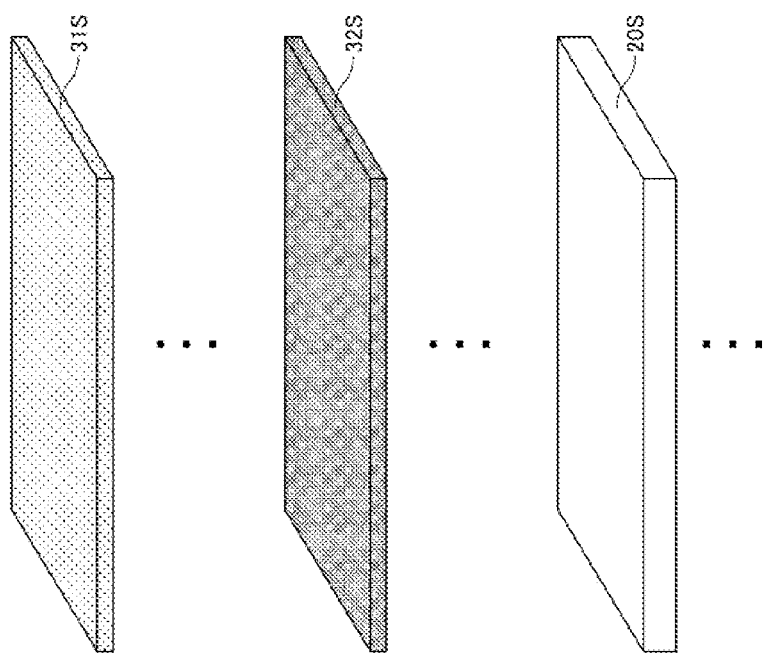
FIG. 2 is a schematic diagram illustrating a method of manufacturing the wavelength conversion member according to the first embodiment.

First, as illustrated in FIG. 2, a required number of a green sheet 31S (light-reflective green sheet) having a reflective material, a green sheet 32S (light-shielding green sheet) having a light shielding material, and a ceramic sheet 20S having a phosphor is prepared. The green sheets 31S and 32S are obtained by, for example, preparing a slurry containing powders, binders, solvents, etc., as main materials and performing a known method such as a doctor-blade method. When a plurality of the green sheets 31S are used, the slurry is preferably adjusted so that the green sheets 31S have the same density. In this manner, shrinkage rates of the green sheets 31S before and after firing (a ratio of the dimension of the green sheet 31S after firing to the dimension of the green sheet 31S before firing) can be made uniform between the green sheets 31S, so that the variation in the thicknesses of the light reflecting layer 31 after the firing can be reduced. When a plurality of the green sheets 32S are used, the slurry is preferably adjusted so that the green sheets 32S have the same density. In this manner, shrinkage rates of the green sheets 32S before and after firing (a ratio of the dimension of the green sheet 32S after firing to the dimension of the green sheet 32S before firing) can be made uniform between the green sheets 32S, so that the variation in the thicknesses of the light shielding layer 32 after the firing can be reduced. In the present specification, the phrase "having the same density" means that the difference in density ($g/cm^3$) is within 10%. Examples of the main material of the green sheets 31S, 32S include aluminum oxide, yttrium oxide, titanium oxide, zirconium oxide, silicon oxide, etc. The green sheet 32S further includes a light absorber mixed with the main material. Examples of the light absorber to be mixed include ruthenium oxide, aluminum nitride, silicon nitride, etc.

The ceramic sheet 20S is obtained, for example, by preparing a slurry containing a phosphor powders, binders, solvents, etc., obtaining a phosphor green sheet by using a known method such as a doctor-blade method, and firing the phosphor green sheet at a predetermined temperature. In order to increase the density, the ceramic sheet 20S is preferably fired at a temperature higher than a firing temperature in a firing step described later. The ceramic sheet 20S is prepared so as to have a thickness equal to a length of one side of the light-emitting portion 20 of the wavelength conversion member 10 to be obtained. Examples of the phosphor contained in the ceramic sheet 20S include yttrium aluminum garnet (YAG) activated with cerium, lutetium aluminum garnet (LAG) activated with cerium, silicate activated with europium ($(Sr, Ba)_2SiO_4$), αSiAlON phosphor, and βSiAlON phosphor.

Each sheet preferably has a rectangular shape with substantially the same size, for example, in a top view viewed from above the largest surface of the sheet. When each sheet has a rectangular shape in a top view, the wavelength conversion member 10 can be efficiently prepared in the cutting step to be described below in the case of preparing the rod-shaped wavelength conversion member 10. In addition, the portion to be discarded after the cutting step can be reduced. The shape of each sheet in a top view is not limited thereto, and may be a parallelogram, a circle, an elliptical shape, or another shape.

Subsequently, as illustrated on the upper side of the arrow in FIG. 3, a plurality of layered bodies 30S are prepared such that the green sheet 31S, the green sheet 32S, and the green sheet 31S are layered in this order in each of the layered bodies 30S. Furthermore, the thickness of the layered body 30S is adjusted by pressurization, etc., such that the pitch between the light-emitting portions 20 of the wavelength conversion member 10 to be prepared becomes a desired size. In consideration of the subsequent pressurizing step and the firing step, it is desirable that the thickness of the layered body 30S is preferably 1.2 to 2 times the pitch between the light-emitting portions 20 of the wavelength conversion member 10. Then, as illustrated on the lower side of the arrow in FIG. 3, the plurality of layered bodies 30S and the plurality of ceramic sheets 20S are alternately layered to prepare a composite 100 (composite preparation step). In the example of FIG. 3, the green sheets 31S are disposed below the lowermost ceramic sheet 20S and above the uppermost ceramic sheet 20S, respectively. The composite 100 may be prepared by layering sheets in order from the lower sheet illustrated in FIG. 3.

Preparing the plurality of layered bodies 30S in each of which the three green sheets 31S and 32S are layered and then alternately layering the plurality of layered bodies 30S and the plurality of ceramic sheets 20S to prepare the composite 100 allows for reducing unevenness in shrinkage of each layered body 30S in the pressurizing step of the composite 100 to be described below.

As compared with the case in which the green sheets 31S and the green sheet 32S are adjusted in thickness to respective desired thicknesses and laminated one by one together with the ceramic sheets 20S, adjusting a thickness of each layered body 30S in which the three green sheets are laminated and laminating each layered body 30S with the ceramic sheet 20S allows for reducing deviations in the thicknesses of the layered bodies 30S to serve as the pitch between the light-emitting portions 20 of the wavelength conversion member 10, so that variations in the thicknesses among the laminated bodies 30S can be reduced. In FIG. 3, the green sheet 31S and the green sheet 32S are indicated by dot patterns having different densities instead of assigning reference numerals to all of the green sheets 31S and 32S. The same applies to FIGS. 4 to 6 to be described below.

Subsequently, the composite 100 illustrated in FIG. 3 is pressurized and fired to prepare the composite 100A illustrated in FIG. 4. Specifically, first, the composite 100 illustrated in FIG. 3 is pressurized from the upper and lower surface (pressurizing step). The pressurization of the composite 100 can be performed by, for example, a cold isostatic pressing device, etc. In the pressurizing step, a pressure of 80 MPa or more is preferably applied to the composite 100. It is more preferable that a pressure of 100 MPa or more is applied in the pressurization. Thus, the density of the green sheets 31S and 32S can be increased, so that the shrinkage rate of the green sheets 31S and 32S during firing can be reduced, which allows for reducing the occurrence of cracks in the green sheets 31S and 32S during firing. Furthermore, the variation in thickness of the green sheets 31S and 32S after firing can be reduced. Also, the thickness of the green sheets 31S and 32S after firing can be reduced, so that the wavelength conversion member 10 having a narrow pitch of the light-emitting portions 20 can be realized.

Subsequently, the composite 100 after the pressurization is fired to obtain the composite 100A (firing step). In the firing step, the firing temperature is, for example, from 1300 to 1500° C. The firing of the composite 100 can be performed, for example, by a hot press, etc. At this time, the firing is preferably performed while applying pressure to upper and lower surfaces of the composite 100. A pressure applied to the composite 100 in the firing step is lower than a pressure applied to the composite 100 in the pressurizing step. In the firing step, a pressure of, for example, 10 MPa or less is applied to the composite 100. The pressurizing step and the firing step may be performed simultaneously. That is, the firing may be performed while applying the composite 100 to a pressure of 100 MPa or more, for example.

The shrinkage rate of the ceramic sheet 20S before and after the steps of pressurizing and firing the composite 100 is smaller than the shrinkage rate of the layered body 30. In other words, with the ceramic sheet 20S fired at a temperature higher than the firing temperature in the firing step before the composite preparation step, almost no contraction in the layering direction occurs in the steps of pressurizing and firing the composite 100. On the other hand, the green sheets 31S and 32S shrink in the layering direction by about 20 to 30% in the pressurizing step and about 10% in the firing step. That is, the thickness of the ceramic sheet 20S in the composite body 100A is similar to the thickness of the ceramic sheet 20S in the composite body 100, but the thicknesses of the green sheets 31S and 32S in the composite body 100A are smaller than the thicknesses of the green sheets 31S and 32S in the composite body 100. Reduction in thickness of the green sheet 31S and 32S allows for narrowing the pitch of the ceramic sheets 20S. The lengths of the plurality of the layered bodies 30S in the layering direction after firing are preferably equal to each other. Accordingly, the pitch of the light-emitting portions 20 can be made uniform in the wavelength conversion member 10 to be obtained. As used herein, the term "equal" allows a difference within ±10%.

Subsequently, as illustrated in FIGS. 5 and 6, the composite 100A is cut to prepare a plurality of the wavelength conversion members 10 (a plurality of composite pieces). In the illustrated example, the layering direction coincides with the first direction X. The composite 100A can be cut using, for example, a wire saw.

As illustrated in FIG. 5, the composite 100A is cut in a plane parallel to a first plane formed by the first direction X and the second direction Y. The cutting surface parallel to the first plane is parallel to the layering direction (first direction X) of the composite 100A. In the example illustrated in FIG. 5, the composite 100A is cut in the layering direction along a plurality of dot-dash lines CL1 parallel to the second direction Y, to prepare a plurality of composites 100B. In the example illustrated in FIG. 5, there are fourteen dot-dash lines CL1, and fifteen composites 100B are prepared. Any appropriate number of dot-dash lines CL1 can be set, and the number of dot-dash lines CL1 is not limited to the example of FIG. 5. The terms "parallel" and "perpendicular" in the present specification allows a deviation within ±5 degrees. The same applies to the description of FIG. 6.

In the present specification, a surface of the composite or the wavelength conversion member (the composite piece) that is not perpendicular to a straight line parallel to the layering direction (first direction X) is referred to as a "layering surface". More specifically, the layering surface is a plane parallel to a straight line parallel to the layering direction (first direction X) of the composite. The illustrated composite has four layering surfaces. For example, in each of the composites 100B illustrated in FIG. 5, four lateral surfaces parallel to the layering direction (first direction X) are layering surfaces. Specifically, two lateral surfaces parallel to the XY plane and the two lateral surfaces parallel to the XZ plane, are layering surfaces. In the illustrated example, the two lateral surfaces parallel to the YZ plane are not included in the layering surfaces. That is, a surface having a lateral surface of one sheet or layer, for example, a surface having a lateral surface of the ceramic sheet 20S or the light reflecting layer 31, is not referred to as the layering surface. A surface having a lateral surface of two or more sheets or layers is referred to as the layering surface. The layering surface includes a surface that is a portion or the whole of the lateral surface of the composite 100A before being cut. Further, the layering surface includes a cutting surface formed when performing the cutting described above, and a cutting surface parallel to the first plane, and a cutting surface parallel to a second plane described below is included in the layering surface in which the plurality of ceramic sheets 20S and the layered body 30S are layered.

The method includes a step of grinding the layering surface of the composite 100B after preparing the composite 100B. Specifically, the two layering surfaces parallel to the first plane (layering surfaces parallel to the XY plane) including the cutting surface formed in the cutting step described above are ground. By grinding the two layering surfaces of the composite 100B, the variation in the thickness of the third direction Z of each ceramic sheet 20S can be reduced. Also, the thickness of each ceramic sheet 20S in the third direction Z can be adjusted to the desired thickness. The method may further include a polishing step of polishing the two layering surfaces described above. By polishing the two layering surfaces, the surface accuracy of the two layering surfaces of the composite 100B can be improved. For example, the polished layering surface can be an upper or lower surface of the wavelength conversion member 10 made to be subsequently singulated and prepared. Note that all four layering surfaces may be ground and polished, or the polishing step may not be provided.

Subsequently, as illustrated in FIG. 6, the composite 100B is cut in a plane parallel to a second plane formed from the first direction X and the third direction Z. The cutting surface formed by cutting a plane parallel to the second plane is in a direction parallel to the first direction X (layering direction) of the composite 100B. The first plane and the second plane are planes parallel to the first direction X (layering direction). That is, the cutting surface formed during cutting in the cutting step is parallel to the layering direction. In a plane perpendicular to the layering direction, the composites 100A, 100B are not cut. In the example illustrated in FIG. 6, the composite 100B is cut in the vertical direction along a plurality of dot-dash lines CL2 parallel to the first direction X, to prepare the plurality of wavelength conversion members 10. In the example illustrated in FIG. 6, three of the dot-dash lines CL are provided, and four wavelength conversion members 10 are prepared from one composite 100B. Since fifteen composites 100B are prepared in the step of FIG. 5, a total of sixty wavelength conversion members 10 are prepared in this step. The number of dot-dash lines CL2 is discretionary, and is not limited to the example of FIG. 6. In the prepared wavelength conversion member 10, the layer formed by firing the green sheet 31S having the reflective material and the layer formed by firing the green sheet 32S having the light shielding material are made of a ceramic, and the light shielding material includes a light absorber.

The first plane and the second plane intersect each other. The first plane and the second plane are preferably orthogonal to each other. With this configuration, the cutting surface formed when cutting is performed in a plane parallel to the first plane and the cutting surface formed when cutting is performed in a plane parallel to the second plane are orthogonal to each other. Cutting along planes orthogonal to each other allows for efficiently preparing the rod-shaped wavelength conversion member 10, for example, when the composite 100 is prepared by layering rectangular sheets. At this time, the upper surface, the lower surface, and the lateral surface of the wavelength conversion member 10 are rectangular. The angle at which the two cutting surfaces intersect each other is not limited to a right angle. By performing cutting in two planes, the wavelength conversion member 10 having a desired shape can be manufactured regardless of the shape of the composite 100. In a case in which the plurality of wavelength conversion members 10 having a desired shape can be manufactured only by cutting in one plane, the cutting in the two planes is unnecessary. Examples of such a case include a case in which one side of the wavelength conversion member is extremely short and a case in which only a small number of wavelength conversion members are prepared.

Figure 7:
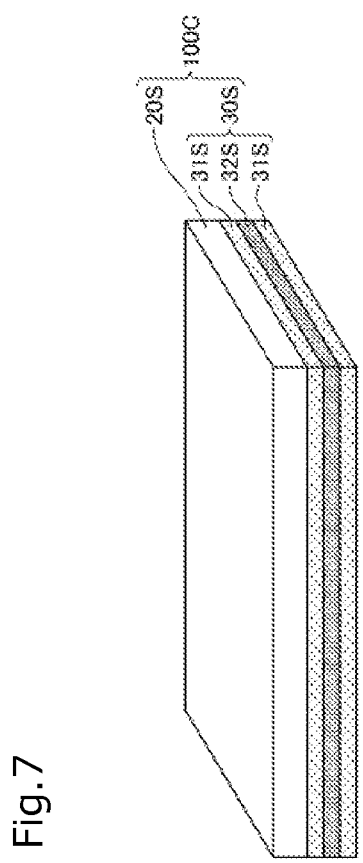
FIG. 7 is further another schematic diagram illustrating the method of manufacturing the wavelength conversion member according to the first embodiment.
Figure 8:
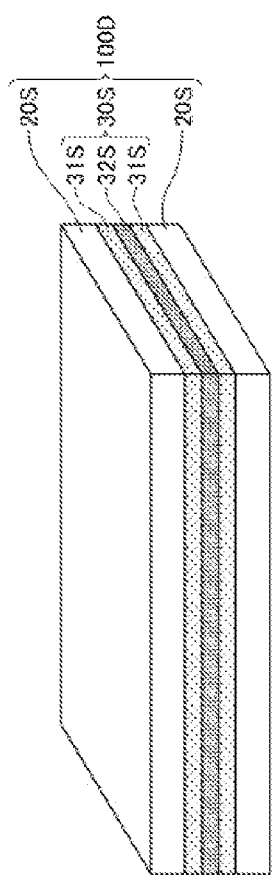
FIG. 8 is a still yet another schematic diagram illustrating the method of manufacturing the wavelength conversion member according to the first embodiment.

The composite preparation step is not limited to the step of alternately layering the plurality of layered bodies 30S and the plurality of ceramic sheets 20S, as illustrated in FIG. 3. The composite preparation step may be, for example, a step of preparing a composite 100C by layering one layered body 30S and one ceramic sheet 20S, as illustrated in FIG. 7. Additionally, as illustrated in FIG. 8, the composite preparation step may be a step of layering the ceramic sheets 20S on both sides of one layered body 30S to prepare a composite 100D. In a case in which the composite illustrated in FIGS. 7 and 8 is prepared, the method of manufacturing the wavelength conversion member according to the present invention is effective.

In the present specification, the "step of alternately layering the ceramic sheet 20S and the layered body 30S" includes the step of preparing the composite illustrated in FIGS. 7 and 8. Also, the "step of alternately layering the plurality of ceramic sheets 20S and the layered body 30S" does not include the step of preparing the composite illustrated in FIG. 7, and includes the step of preparing the composite illustrated in FIG. 8. The "step of alternately layering the plurality of ceramic sheets 20S and the plurality of layered bodies 30S" does not include the step of preparing the composite illustrated in FIGS. 7 and 8.

In this manner, in the method of manufacturing the wavelength conversion member 10 according to the first embodiment, it is possible to realize the method of manufacturing the wavelength conversion member 10 that improves the effect of suppressing the propagation of light from the adjacent light-emitting portions 20. Further, in the method of manufacturing the wavelength conversion member 10 according to the first embodiment, the pitch of the light-emitting portions 20 is determined by the thicknesses of the light reflecting layer 31 prepared by firing the green sheet 31S and the light shielding layer 32 prepared by firing the green sheet 32S. In addition, by adjusting the densities of the green sheets 31S and 32S, errors caused by shrinkage of the green sheets 31S and 32S in the firing step can be reduced. Therefore, by setting the green sheets 31S and 32S to predetermined thicknesses, the pitch of the light-emitting portions 20 can be made substantially constant in the formed wavelength conversion member 10. That is, it is possible to prepare the wavelength conversion member 10 in which the plurality of light-emitting portions 20 are disposed with high positional accuracy.

Modification Example of Wavelength Conversion Member

Figure 9:
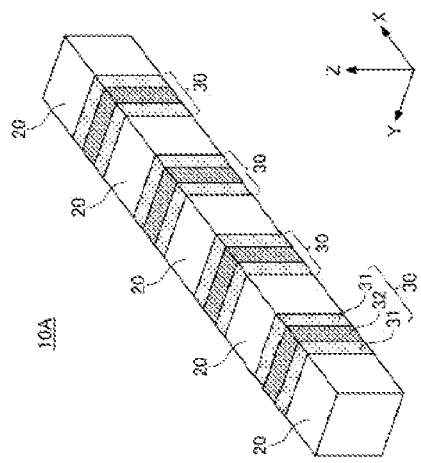
FIG. 9 is a schematic perspective view of a wavelength conversion member according to a first modification example of the first embodiment.

FIG. 9 is a schematic perspective view of a wavelength conversion member according to a first modification example of the first embodiment. In the wavelength conversion member 10 illustrated in FIG. 1, the light reflecting layers 31 are disposed at both ends in the layering direction (first direction X), but the light reflecting layers 31 may not be disposed at both ends in the layering direction as in a wavelength conversion member 10A illustrated in FIG. 9. In the wavelength conversion member 10A, both ends in the layering direction are the light-emitting portions 20. In other words, the two lateral surfaces perpendicular to the layering direction (first direction X) of the wavelength conversion member 10A are the lateral surfaces of the light-emitting portions 20. Even if the light reflecting layers 31 are not disposed at both ends in the layering direction as in the wavelength conversion member 10A, when different light beams are incident on the adjacent light-emitting portions 20, an effect of suppressing interference between the light beams can be obtained.

The wavelength conversion member 10A can be prepared by preparing the composite without disposing the green sheets 31S on a lower side of the ceramic sheet 20S disposed on a lowermost side and an upper side of the ceramic sheet 20S disposed on an uppermost side among the plurality of ceramic sheets 20S in the step illustrated in FIG. 3, and then performing the same steps as those illustrated in FIGS. 4 to 6.

Figure 10:
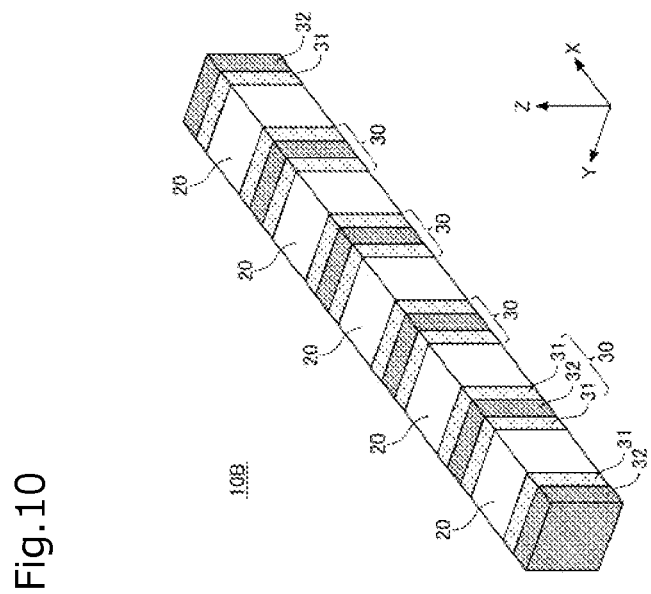
FIG. 10 is a schematic perspective view of a wavelength conversion member according to a second modification example of the first embodiment.
Figure 11:
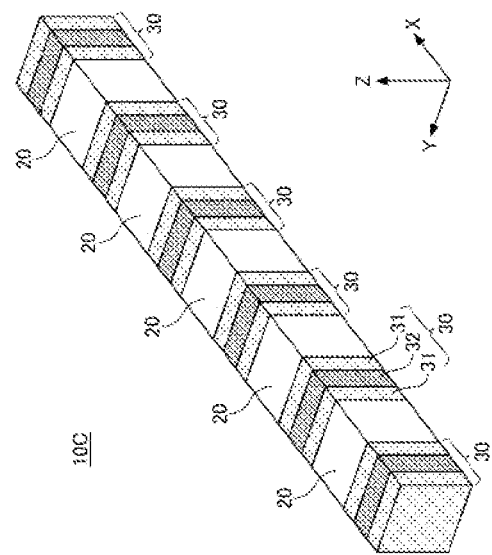
FIG. 11 is a schematic perspective view of a wavelength conversion member according to a third modification example of the first embodiment.

FIG. 10 is a schematic perspective view of a wavelength conversion member according to a second modification example of the first embodiment. In a wavelength conversion member 10B illustrated in FIG. 10, the light reflecting layer 31 and the light shielding layer 32 may be sequentially disposed at each of both ends in the layering direction from the side closer to the light-emitting portion 20. In a plan view viewed from the layering direction, the lateral surface of the light shielding layer 32 is a lateral surface of the wavelength conversion member 10B. The light reflecting layer 31 is disposed so as to be in contact with a lateral surface opposite to a lateral surface of the light shielding layer 32 serving as a lateral surface of the wavelength conversion member 10B. FIG. 11 is a schematic perspective view of a wavelength conversion member according to a third modification example of the first embodiment. As in a wavelength conversion member 10C illustrated in FIG. 11, both ends in the layering direction may be the layered bodies 30. In a plan view viewed from the layering direction, the lateral surface of the light reflecting layer 31 is a lateral surface of the wavelength conversion member 10C. Furthermore, the light shielding layer 32, the light reflecting layer 31, and the light-emitting portion 20 are disposed in this order so as to be in contact with the lateral surface of the light reflecting layer 31 serving as a lateral surface of the wavelength conversion member 10C. The light reflecting layer 31, the layered body of the light reflecting layer 31 and the light shielding layer 32, or the layered body 30 is preferably disposed at each of both ends in the layering direction as in the wavelength conversion members 10, 10B, and 10C because the amount of seeped light from the light-emitting portions 20 in the layering direction can be made uniform or close to uniform between the two light-emitting portions 20 closest to both ends in the layering direction and the other light-emitting portions 20. This can reduce color unevenness and luminance unevenness between the light-emitting portions 20.

The wavelength conversion member 10B can be prepared by disposing the green sheets 32S on the lower side of the lowermost green sheet 31S and the upper side of the uppermost green sheet 31S to prepare the composite in the step illustrated in FIG. 3, and then performing the same steps as those illustrated in FIGS. 4 to 6. The wavelength conversion member 10C can be prepared by preparing the composite without disposing the layered bodies 30 instead of the green sheets 31S on a lower side of the ceramic sheet 20S disposed on a lowermost side and an upper side of the ceramic sheet 20S disposed on an uppermost side among the plurality of ceramic sheets 20S in the step illustrated in FIG. 3, and then performing the same steps as those illustrated in FIGS. 4 to 6.

Second Embodiment

Figure 12:
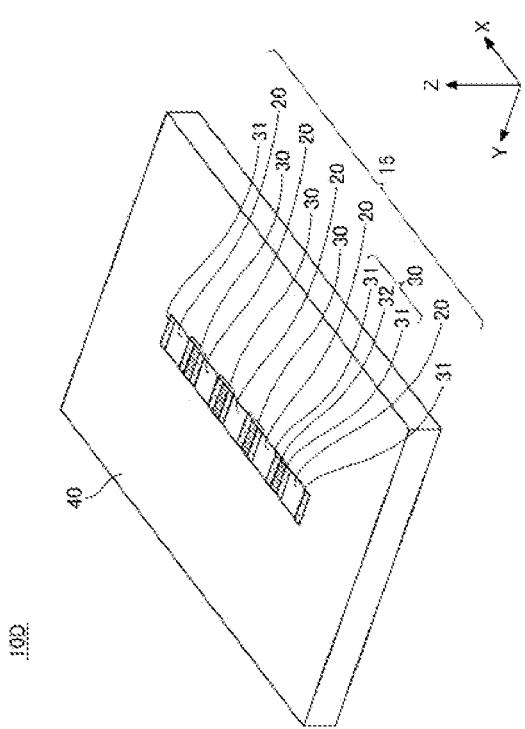
FIG. 12 is a schematic perspective view of a wavelength conversion member according to a second embodiment.

FIG. 12 is a schematic perspective view of a wavelength conversion member according to a second embodiment. In FIG. 12, the X-axis, the Y-axis, and the Z-axis that are mutually orthogonal are illustrated for reference. Directions parallel to the X-axis, the Y-axis, and the Z-axis are defined as a first direction X, a second direction Y, and a third direction Z, respectively. The wavelength conversion member according to the present embodiment further includes a light reflecting portion 40 in the wavelength conversion member 10 according to the first embodiment, such as a wavelength conversion member 10D illustrated in FIG. 12. In the following description, to distinguish the wavelength conversion member 10D and the wavelength conversion member 10, the wavelength conversion member 10 is referred to as a layered portion 15. Note that the wavelength conversion member 10D may include any of the wavelength conversion members 10A, 10B, 10C instead of the wavelength conversion member 10 as the layered portion 15.

The light reflecting portion 40 is, for example, a frame-shaped member having a rectangular opening. The light reflecting portion 40 includes an upper surface, a lower surface opposite to the upper surface, one or more inner lateral surfaces connecting an inner edge of the upper surface and an inner edge of the lower surface, and one or more outer lateral surfaces connecting an outer edge of the upper surface and an outer edge of the lower surface. The outer edge and the inner edge of the upper surface, and the outer edge and the inner edge of the lower surface have, for example, rectangular shapes. In this case, the light reflecting portion 40 includes four inner lateral surfaces having the rectangular shapes and four outer lateral surfaces having the rectangular shapes. Note that the outer edge and the inner edge of the upper surface and the outer edge and the inner edge of the lower surface are not limited to the rectangular shape, and they can have any shape such as a circle, an oval, and a polygon.

The light reflecting portion 40 is, for example, a sintered body formed of a ceramic as a main material. The ceramic used for the main material includes, for example, aluminum oxide, aluminum nitride, silicon oxide, yttrium oxide, zirconium oxide, magnesium oxide, etc. Among them, aluminum oxide is preferable from the perspective of high reflectivity. Among these ceramics, aluminum oxide is also a preferable main material because of its relatively high thermal conductivity. Note that the light reflecting portion 40 may not contain a ceramic as the main material.

In the wavelength conversion member 10D, in a top view, the light reflecting portion 40 surrounds two layering surfaces and two lateral surfaces perpendicular to the layering direction of the layered portion 15. That is, the inner lateral surfaces of the light reflecting portion 40 are connected to two layering surfaces of the four layering surfaces of the layered portion 15. The other two layering surfaces do not connect to the inner lateral surfaces of the light reflecting portion 40. Specifically, the light reflecting portion 40 is connected to two lateral surfaces of each of the light-emitting portions 20, two lateral surfaces of each of the layered bodies 30, and two lateral surfaces in the layering direction of the wavelength conversion member 10, that is, surfaces perpendicular to the layering direction of the two light reflecting layers 31 located at both ends. The wavelength conversion member 10D has a flat plate shape and is, for example, a rectangular parallelepiped.

The two layering surfaces of the layered portion 15 that do not connect to the inner lateral surfaces of the light reflecting portion 40 may be part of the upper surface and the lower surface of the wavelength conversion member 10D. At this time, the upper surface of the layered portion 15 and the upper surface of the light reflecting portion 40 form, for example, one continuous plane. The lower surface of the layered portion 15 and the lower surface of the light reflecting portion 40 form, for example, one continuous plane. The upper surface and/or the lower surface of the layered portion 15 may have a shape protruding from the upper surface and/or the lower surface of the light reflecting portion 40, respectively. In this case, four lateral surfaces of the layered portion 15 are at least partially exposed outward of the inner lateral surfaces of the light reflecting portion 40.

The wavelength conversion member 10D can be manufactured in a slip casting manner, for example. Specifically, the method of manufacturing the wavelength conversion member 10D includes a step of disposing a member containing a ceramic material around the composite 100B (in this case, the layered portion 15 having the same structure as that of the wavelength conversion member 10) that is cut in the step illustrated in FIG. 6 to form the light reflecting portion 40 connected to the two layering surfaces of the cut composite 100B. In addition, the step of disposing the member containing the ceramic material to form the light reflecting portion 40 includes a step of disposing the member in a liquid state containing the ceramic material around the two layering surfaces of the cut composite 100B and firing the member. In this specification, the term "ceramic" refers to a ceramic after firing, and the term "ceramic material" refers to a ceramic material before firing.

By disposing a member in a liquid state containing a ceramic material around the layered portion 15 and firing the member, a large number of voids can be contained in the vicinity of the boundary with the layered portion 15 to increase a void ratio of the formed light reflecting portion 40, allowing for decreasing the void ratio in the vicinity of the outer edge distant from the layered portion 15 as compared with the vicinity of the boundary. By increasing the void ratio in the vicinity of the boundary of the light reflecting portion 40, it is possible to increase the light reflectance in the vicinity of the boundary with the layered portion 15. Furthermore, by reducing the void ratio in the vicinity of the outer edge of the light reflecting portion 40, the density in the vicinity of the outer edge can be increased, and the strength of the entire wavelength conversion member 10D can be ensured.

It is preferable that the density of the light reflecting portion 40 in the vicinity of the boundary with the layered portion 15 is lower than the density of the light reflecting layer 31 formed by firing the green sheet 31S having the reflective material. As described above, by increasing the void ratio of the light reflecting portion 40 in the vicinity of the boundary with the layered portion 15, a larger reflection region due to air is formed at the boundary between the lateral surface of each of the light-emitting portions 20 and the inner lateral surface of the light reflecting portion 40, and the effect of reflecting light incident on the inner lateral surface of the light reflecting portion 40 from the light-emitting portion 20 side to the light-emitting portion 20 side can be enhanced. With such a structure, the light extraction efficiency of the wavelength conversion member 10D can be increased. The void ratio can be adjusted by a sintering condition (sintering temperature, sintering time, rate of temperature increase), a type and particle size of materials, concentration of a sintering aid, etc.

For example, in the wavelength conversion member 10D illustrated in FIG. 12, when a vertical cross section cut in the layering direction (first direction X) so as to pass through a straight line connecting respective midpoints of two sides extending in the second direction Y of the upper surface of the layered portion 15 is observed with a scanning electron microscope (SEM), it can be determined that the light reflecting portion 40 has a lower density than the light reflecting layer 31 in a case in which the proportion (for example, area ratio) of voids included in the light reflecting portion 40 is higher than the proportion of voids included in the light reflecting layer 31.

Third Embodiment

Figure 13:
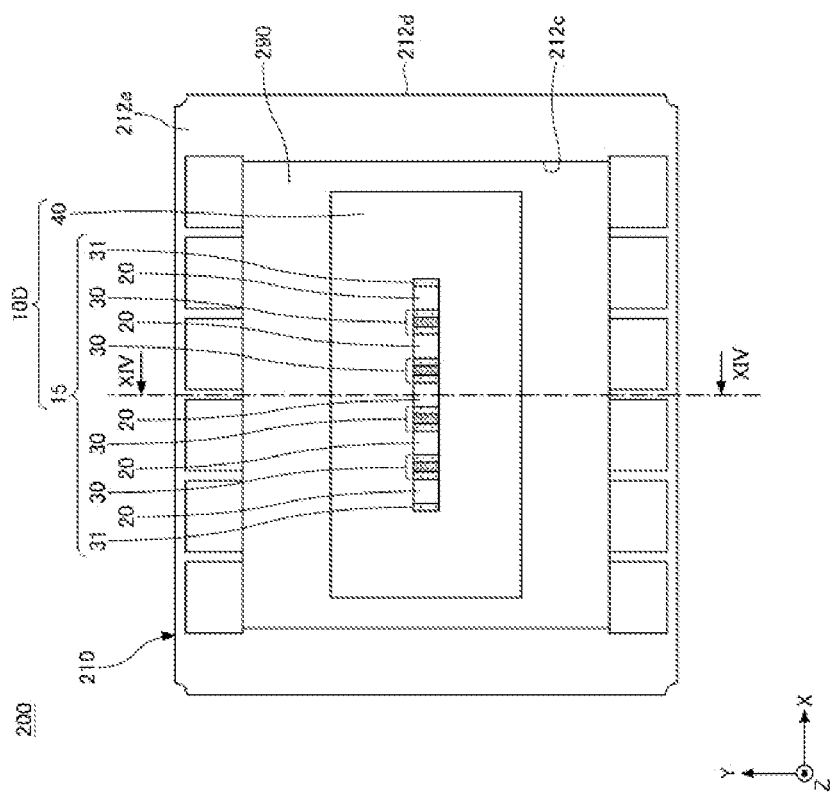
FIG. 13 is a schematic top view of a light-emitting device according to a third embodiment.
Figure 14:
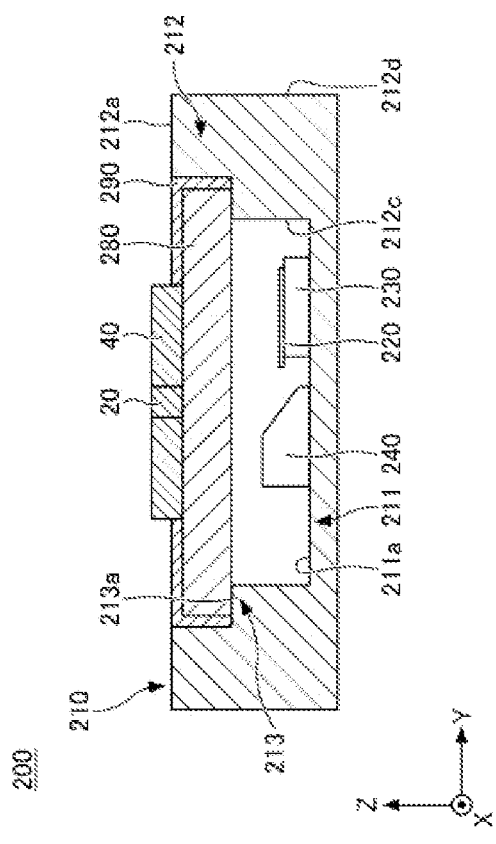
FIG. 14 is a cross-sectional view of the light-emitting device taken along the line XIV-XIV in FIG. 13.
Figure 15:
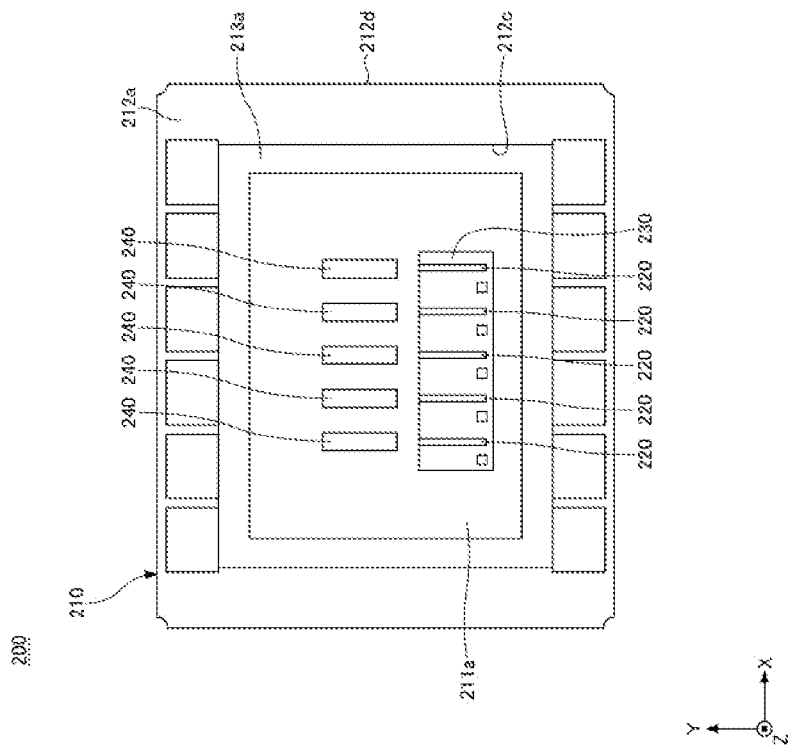
FIG. 15 is a schematic top view illustrating the light-emitting device according to the third embodiment from which the wavelength conversion member, a light-transmissive member, and a light shielding member are removed.

In a third embodiment, an example of a light-emitting device employing the wavelength conversion member according to the second embodiment will be described. FIG. 13 is a schematic top view of a light-emitting device according to a third embodiment. FIG. 14 is a cross-sectional view of the light-emitting device taken along the line XIV-XIV in FIG. 13. FIG. 15 is a schematic top view illustrating the light-emitting device according to the third embodiment from which the wavelength conversion member, a light-transmissive member, and a light shielding member are removed. In FIGS. 13 to 15, the X-axis, the Y-axis, and the Z-axis orthogonal to each other are shown for reference. Directions parallel to the X-axis, the Y-axis, and the Z-axis are defined as a first direction X, a second direction Y, and a third direction Z, respectively.

The light-emitting device according to the third embodiment includes a plurality of light-emitting elements, and a wavelength conversion member, wherein the light emitted from each of the plurality of light-emitting elements is incident on a different light-emitting portion of the wavelength conversion member, and each light-emitting portion converts incident light into light having a different wavelength.

An illustrated light-emitting device 200 is an example of the light-emitting device according to the third embodiment. The light-emitting device 200 includes the wavelength conversion member 10D, a package 210, a plurality of light-emitting elements 220, one or more submounts 230, one or more light reflective members 240, a light-transmissive member 280, and a light shielding member 290.

Each of the components of the light-emitting device 200 will be described. Description of the wavelength conversion member 10D is omitted.

Package 210

The package 210 includes a base portion 211 and a frame portion 212 surrounding the base portion 211 and extending upward. The frame portion 212 has a stepped portion 213 on the inner side thereof. The base portion 211 has an upper surface 211a and a lower surface. The frame portion 212 includes an upper surface 212a, one or more inner lateral surfaces 212c, and one or more outer lateral surfaces 212d. The stepped portion 213 is provided inside the frame portion 212 and has an inner lateral surface 212c connected to an upper surface 213a of the frame portion. The upper surface 213a of the stepped portion 213 is located above the upper surface 211a of the base portion and below the upper surface 212a of the frame portion. A plurality of electrodes are provided on the upper surface 212a of the illustrated frame portion 212.

The package 210 can be formed, for example, of a ceramic as a main material. For example, aluminum nitride, silicon nitride, aluminum oxide, or silicon carbide can be used as the ceramic. The package 210 is not limited to ceramic, and may mainly be another material such as metal.

Light-Emitting Element 220

The light-emitting element 220 is, for example, a semiconductor laser element. The light-emitting element 220 is not limited to a semiconductor laser element, and may be, for example, a light-emitting diode (LED) or an organic light-emitting diode (OLED).

The light-emitting element 220 has, for example, a rectangular outer shape in a top view. A lateral surface intersecting one of the two short sides of the rectangle serves as an emission surface of light emitted from the light-emitting element 220. Further, an upper surface and a lower surface of the light-emitting element 220 each have a larger area than the emission surface.

A case in which the light-emitting element 220 is a semiconductor laser element will be described below. The light (laser beam) emitted from the light-emitting element 220 exhibits divergence and an elliptical far field pattern (hereinafter referred to as "FFP") on a plane parallel to the emission surface.

As used herein, the FFP indicates a shape and a light intensity distribution of the emitted light at a position apart from the emission surface.

In the elliptical shape of light emitted from the light-emitting element 220, a long-diameter direction of the elliptical shape is referred to as a fast axis direction of the FFP, and a short-diameter direction of the elliptical shape is referred to as a slow axis direction of the FFP. The fast axis direction of the FFP in the light-emitting element 220 may coincide with a layering direction in which a plurality of semiconductor layers including an active layer of the light-emitting element 220 are layered.

Based on the light intensity distribution of the FFP of the light-emitting element 220, light having an intensity of $1/e^2$ times or greater of a peak intensity value is referred to as a main part of light. In this light intensity distribution, an angle corresponding to the intensity of $1/e^2$ is referred to as a divergence angle. The divergence angle of the FFP in the fast axis direction is greater than the divergence angle of the FFP in the slow axis direction.

Further, light at the center of the elliptical shape of the FFP, in other words, light exhibiting a peak intensity in the light intensity distribution of the FFP, is referred to as light traveling on an optical axis or light passing through an optical axis. Further, the optical path of the light traveling on the optical axis is referred to as the optical axis of the light.

As the light-emitting element 220, for example, a semiconductor laser element that emits blue light can be employed.

Blue light refers to light having an emission peak wavelength within a range of 420 nm to 494 nm. When a semiconductor laser element is used in combination with a YAG phosphor, for example, a semiconductor laser element that emits light having a peak wavelength of 480 nm or less is preferably used in consideration of the excitation efficiency.

Examples of the semiconductor laser element that emits blue light include a semiconductor laser element including a nitride semiconductor. GaN, InGaN, and AlGaN, for example, can be used as the nitride semiconductor. As the light-emitting element 220, a semiconductor laser element that emits light other than blue light may be used.

Submount 230

The submount 230 is configured, for example, in a rectangular parallelepiped shape and has a lower surface, an upper surface, and a lateral surface. Note that the shape of the submount 230 need not necessarily be the rectangular parallelepiped. The submount 230 is formed using, for example, aluminum nitride or silicon carbide, although other materials may be used. Further, a metal film, for example, is provided on the upper surface of the submount 230.

Light Reflective Member 240

The light reflective member 240 has a light reflecting surface that reflects light. The light reflecting surface is, for example, a surface having a light reflectance of 90% or more to the peak wavelength of the irradiated light. The light reflectance in the example herein may be 100% or may be less than 100%. The light reflecting surface is inclined with respect to a lower surface of the light reflective member 240. The inclination angle of the light reflecting surface relative to the lower surface is, for example, 45 degrees.

For the light reflective member 240, it is preferable to select a heat-resistant material as a main material, and for example, glass such as quartz or BK7 (borosilicate glass), metal such as aluminum, or Si can be used. The light reflecting surface can be formed using, for example, metal such as Ag or Al, or a dielectric multilayer film of $Ta_2O_5/SiO_2$, $TiO_2/SiO_2$, or $Nb_2O_5/SiO_2$. As used herein, the expression "A/B" indicates a multilayer film in which a film A and a film B are layered in order.

Light-Transmissive Member 280

The light-transmissive member 280 is a member having transmissivity. As used herein, the phrase "having transmissivity" means that the light transmittance with respect to the peak wavelength of incident light is 80% or more. The light-transmissive member 280 includes an upper surface, a lower surface opposite to the upper surface, and lateral surfaces intersecting the upper surface and the lower surface. The lateral surfaces connect an outer edge of the upper surface and an outer edge of the lower surface. The light-transmissive member 280 is, for example, a rectangular parallelepiped or a cube. In this case, both the upper surface and the lower surface of the light-transmissive member 280 are rectangular, and the light-transmissive member 280 has four rectangular lateral surfaces.

However, the light-transmissive member 280 is not limited to being the rectangular parallelepiped or the cube. That is, in the top view, the shape of the light-transmissive member 280 is not limited to the rectangular shape, and it can have any shape such as a circle, an oval, and a polygon.

The light-transmissive member 280 has a base material formed in a flat plate shape such as a rectangular parallelepiped. The base material of the light-transmissive member 280 can be formed using, for example, sapphire as a main material. Sapphire is a material with relatively high transmittance and relatively high strength. In addition to sapphire, a light-transmissive material including quartz, silicon carbide, glass, etc. may be used as the main material.

Light Shielding Member 290

The light shielding member 290 can be formed of, for example, a resin having light shielding properties. Here, "light shielding properties" indicate properties that do not allow light to pass through, and the light shielding properties may be implemented by utilizing light absorbing properties, light reflective properties, etc. in addition to the light blocking properties. The light shielding member 290 can be formed, for example, by containing fillers made of a light diffusing material and/or a light absorbing material in the resin.

Examples of the resin that forms the light shielding member 290 include an epoxy resin, a silicone resin, an acrylate resin, a urethane resin, a phenol resin, and a BT resin. Examples of the light absorbing fillers contained in the light shielding member 290 include dark-colored pigments such as carbon black.

Light-Emitting Device 200

In the example of the light-emitting device 200 illustrated, the wavelength conversion member 10D is joined to the upper surface of the light-transmissive member 280. The wavelength conversion member 10D is smaller than the light-transmissive member 280 in a top view, for example. The light-transmissive member 280 is joined to the lower surface of the wavelength conversion member 10D on the upper surface thereof. In a top view, each of the light-emitting portions 20 of the wavelength conversion member 10D is located inside the outer edge shape of the upper surface of the light-transmissive member 280.

The outer peripheral portion of the lower surface of the light-transmissive member 280 is joined to, for example, the upper surface 213a of the stepped portion 213 provided inside the frame portion 212 of the package 210. The light-transmissive member 280 is joined to the package 210 to form a closed space in which the light-emitting element 220 is disposed. In this manner, in the light-emitting device 200, the light-transmissive member 280 can serve as a lid member. This closed space is formed in a hermetically sealed state. By being hermetically sealed, collection of dust such as organic substances on the emission surface of the light-emitting element 220 can be suppressed.

In the illustrated example of the light-emitting device 200, five light reflective members 240 are disposed on the upper surface 211a of the base portion 211. The five light reflective members 240 are disposed on the same metal film, for example, and the lower surface of the metal film is joined to the upper surface 211a of the base portion 211. The five light reflective members 240 may each be disposed on a different metal film. The five light reflective members 240 are disposed at predetermined intervals in the X direction in a top view, for example.

In the illustrated example of the light-emitting device 200, one submount 230 is disposed on the upper surface 211a of the base portion 211. The submount 230 is disposed on the metal film, and the lower surface of the metal film is joined to the upper surface 211a of the base portion 211. The submount 230 has a rectangular shape in a top view, for example, and is disposed in the X direction on the long side of the rectangle. The submount 230 is disposed on the metal film on which the light reflective member 240 is disposed. Note that the submount 230 and the light reflective member 240 may be disposed on different metal films. A plurality of the submounts 230 may be disposed on the metal film.

Each of the light-emitting elements 220 is disposed on the upper surface 211a of the base portion 211. Specifically, each of the light-emitting elements 220 is disposed on the upper surface of the submount 230. In the illustrated example of the light-emitting device 200, five light-emitting elements 220 are disposed on the upper surface of the same submount 230, and the lower surface of the submount 230 is joined to the upper surface 211a of the base portion 211. Additionally, the five light-emitting elements 220 have a rectangular shape in a top view, for example, and are disposed at predetermined intervals in the X direction with the long side of the rectangle facing the Y direction. In a top view, the emission surface of each of the light-emitting elements 220 is parallel or perpendicular to the inner lateral surface 212c or the outer lateral surface 212d of the frame portion 212. Each of the light-emitting elements 220 is disposed such that their emission surfaces face in the same direction. Each of the light-emitting elements 220 may be disposed on the upper surfaces of different submounts 230.

Each light reflective member 240 includes a light reflecting surface inclined toward each of the light-emitting elements 220. In each of the light-emitting elements 220, the light emitted from the emission surface is applied to the light reflecting surface of the corresponding light reflective member 240. The corresponding light reflective member 240 is a light reflective member 240 having a surface facing the emission surface of each light-emitting element 220 in a top view. The light-emitting element 220 is disposed such that at least the main part of light is irradiated to the light reflecting surface.

The main part of the light emitted by each light-emitting element 220 is reflected by the light reflecting surface of the corresponding light reflective member 240 and enters the light-transmissive member 280. The main part of the light reflected by the light reflecting surface of each light reflective member 240 is incident on each of the light-emitting portions 20 after passing through the light-transmissive member 280. Part or all of the light incident on each of the light-emitting portions 20 is converted into light having a different wavelength by each of the light-emitting portions 20. The light incident on each of the light-emitting portions 20 or the light wavelength-converted by each of the light-emitting portions 20 is emitted from the upper surface of each of the light-emitting portions 20 to the outside of the light-emitting device 200. In the light-emitting device 200, each light-emitting element 220 can be driven individually.

The light shielding member 290 is formed above the light-transmissive member 280. The light shielding member 290 is formed so as to fill a gap between the frame portion 212 of the package 210 and the wavelength conversion member 10. The light shielding member 290 can be formed by, for example, pouring a thermosetting resin and curing the poured resin with heat. By providing the light shielding member 290, leakage of light is suppressed.

The light shielding member 290 does not reach the upper surface of the wavelength conversion member 10D. Alternatively, even when the light shielding member 290 reaches the upper surface of the light reflecting portion 40 of the wavelength conversion member 10D, the light shielding member 290 does not reach the upper surface of the light-emitting portion 20.

In the light-emitting device 200, the plurality of light-emitting portions 20 are disposed in the wavelength conversion member 10D with high positional accuracy, so that the main part of the light reflected by the light reflecting surface of each light reflective member 240 can be reliably made incident on the corresponding light-emitting portion 20. In addition, in the light-emitting device 200, propagation of light from the adjacent light-emitting portions 20 can be suppressed by the layered body 30, so that light can be individually incident on each of the light-emitting portions 20 without substantially causing interference of light in the adjacent light-emitting portions 20, and light subjected to wavelength conversion in the light-emitting portion 20 can be emitted.

The light-emitting device 200 can be used, for example, for an on-vehicle headlight. The light-emitting device 200 is not limited thereto, and can be used for illumination, a projector, a head-mounted display, and a light source such as a backlight of other displays.

Although the preferred embodiments and the like have been described in detail above, the disclosure is not limited to the above-described embodiments and the like, various modifications and substitutions can be made to the above-described embodiments and the like without departing from the scope described in the claims.

What is claimed is:

1. A wavelength conversion member comprising:
   three or more light-emitting portions, each having a phosphor, being separated from each other, and being disposed to be aligned in a first direction;
   two or more layered bodies, each having a light reflective layer and a light shielding layer aligned in the first direction with the light reflective layer, wherein
   the light-emitting portion and the layered body are alternately aligned in the first direction so that each of the layered bodies is interposed between adjacent ones of the light-emitting portions,
   in the first direction, a length of each of the light-emitting portions is in a range of 0.3 mm to 2.0 mm, and
   an interval in the first direction between the two light-emitting portions adjacent to each other is in a range of 0.1 mm to 2.0 mm.

2. The wavelength conversion member according to claim 1, wherein
   a length in the first direction of each of the two light-emitting portions adjacent to each other is greater than the interval between the two light-emitting portions adjacent to each other.

3. The wavelength conversion member according to claim 1, wherein
   in each of the light-emitting portions, a lower surface is a light incident surface, and an upper surface is a light emission surface.

4. The wavelength conversion member according to claim 1 further comprising:
   a light reflecting portion that covers two lateral surfaces of the light-emitting portion and the light shielding layer alternately disposed in the first direction, the two lateral surfaces facing each other in a direction perpendicular to the first direction.

5. A light-emitting device comprising:
   three or more light-emitting elements; and
   the wavelength conversion member according to claim 4, wherein
   light emitted from each of the three or more light-emitting elements is incident on a respective one of the light-emitting portions.

6. The light-emitting device according to claim 5, wherein
   each light-emitting element is configured to be driven individually.

7. The light-emitting device according to claim 5, wherein
   the light-emitting element is a semiconductor laser element.

8. A light-emitting device comprising:
   a light-emitting element configured to emit light; and
   the wavelength conversion member according to claim 4, wherein an output of the light incident on each light-emitting portion is individually controllable.

9. A light-emitting device comprising:
three or more light-emitting elements; and
the wavelength conversion member according to claim 1, wherein
light emitted from each of the three or more light-emitting elements is incident on a respective one of the light-emitting portions.

10. The light-emitting device according to claim 9, wherein
each light-emitting element is configured to be driven individually.

11. The light-emitting device according to claim 9, wherein
the light-emitting element is a semiconductor laser element.

12. A light-emitting device comprising:
a light-emitting element configured to emit light; and
the wavelength conversion member according to claim 1, wherein
an output of the light incident on each light-emitting portion is individually controllable.

13. A light-emitting device comprising:
three or more light-emitting elements; and
a wavelength conversion member including
three or more light-emitting portions, each having a phosphor, being separated from each other, and being disposed to be aligned in a first direction, and
two or more light shielding layers, each being disposed between the two light-emitting portions adjacent to each other, wherein
the wavelength conversion member is spaced apart from the three or more light-emitting elements such that a hollow space is located between the wavelength conversion member and the three or more light-emitting elements, wherein
the light-emitting portion and the light shielding layer are alternately aligned in the first direction,
in the first direction, a length of each of the light-emitting portions is in a range of 0.3 mm to 2.0 mm,
an interval in the first direction between the two light-emitting portions adjacent to each other is in a range of 0.1 mm to 2.0 mm, and
light emitted from each of the three or more light-emitting elements is incident on a respective one of the light-emitting portions.

14. The light-emitting device according to claim 13, wherein
surfaces of the three or more light-emitting portions facing toward the hollow space and surfaces of the two or more light shielding layers facing toward the hollow space are flush with each other.

\* \* \* \* \*